United States Patent [19]

Urushima

[11] Patent Number: 5,503,321
[45] Date of Patent: Apr. 2, 1996

[54] BONDING TOOL EMPLOYED IN ULTRASONIC COMPRESSION BONDING APPARATUS

[75] Inventor: Michitaka Urushima, Tokyo, Japan

[73] Assignee: NEC Corporation, Tokyo, Japan

[21] Appl. No.: 317,602

[22] Filed: Sep. 29, 1994

[30] Foreign Application Priority Data

Oct. 7, 1993 [JP] Japan ............................... 5-251274
Jul. 26, 1994 [JP] Japan ............................... 6-174423

[51] Int. Cl.⁶ ................................................ H01L 21/60
[52] U.S. Cl. .................................... 228/1.1; 228/44.7
[58] Field of Search ........................ 228/110.1, 1.1, 228/6.2, 44.7, 51, 55; 156/73.2, 580.2

[56] References Cited

U.S. PATENT DOCUMENTS

| | | | |
|---|---|---|---|
| 3,690,538 | 9/1972 | Gaiser et al. | 228/1.1 |
| 3,954,217 | 5/1976 | Smith | 228/1.1 |
| 4,776,509 | 10/1988 | Pitts et al. | 228/1.1 |
| 4,778,097 | 10/1988 | Hauser | 228/1.1 |
| 5,223,063 | 6/1993 | Yamazaki et al. | 228/179.1 |
| 5,269,452 | 12/1993 | Sterczyk | 228/49.2 |
| 5,288,006 | 2/1994 | Otsuka et al. | 228/179.1 |

OTHER PUBLICATIONS

IBM Technical Disclosure Bulletin, "Ultrasonic Bonding Tip", vol. 10, No. 12, p. 1892, May 1968.
IBM Technical Disclosure Bulletin, "Twin Grooved Bonding Tool", vol. 36, No. 10, pp. 589, 590, Oct. 1993.

*Primary Examiner*—Samuel M. Heinrich
*Attorney, Agent, or Firm*—Whitham, Curtis, Whitham & McGinn

[57] ABSTRACT

A bonding tool for connecting inner leads to pads of a semiconductor chip by means of high efficiency transmittance of ultrasonic vibrations is disclosed. The shape of the tool as seen in a plane parallel to the ultrasonic vibration is either to have a substantially flat plane on one side and a uniformly continuous sloped plane with a predetermined angle starting from a pressing face against the inner lead, or to have the shape of a uniformly continuous machined conical surface starting upwardly from the pressing face until the diameter of the cone reaches 200 μm or more.

20 Claims, 6 Drawing Sheets

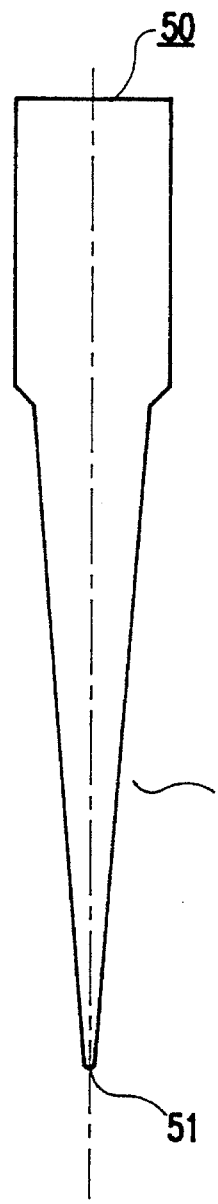
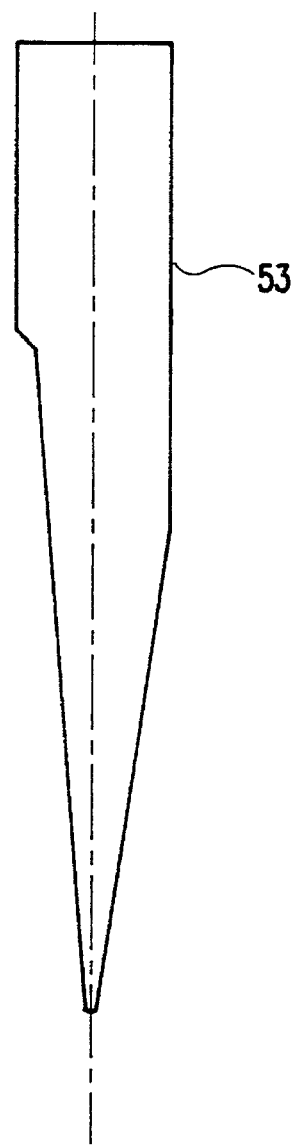
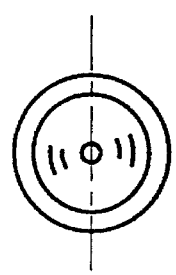
FIG.5A  FIG.5C
FIG.5B

BONDING TOOL EMPLOYED IN ULTRASONIC COMPRESSION BONDING APPARATUS

BACKGROUND OF THE INVENTION

1. Field of the Invention

The present invention relates to a bonding tool and, more particularly, to a bonding tool for connecting inner leads and outer leads of a film carrier or the like to bonding pads of a semiconductor element and wirings of a printed wiring board, respectively, by means of ultrasonic compression bonding or ultrasonic thermocompression bonding.

2. Description of the Related Art

The bonding pads of a semiconductor element are ordinarily connected to a lead frame or a printed wiring board using bonding wires. However, in order to deal with fine patterning accompanying the increase in the number of pins used, the connection by means of a tape-automated-bonding (TAB) system is also being employed. In the TAB system, the gang bonding method is generally used in which the inner leads of the film carrier are connected in a batch by the thermocompression bonding to the corresponding bonding pads of the semiconductor element. However, the size of the semiconductor elements is being increased year after year along with the advances in the integrated circuit technoology, and accompanying that the number of the pads is also being increased. Because of this, the batch connection by the gang bonding method is becoming increasingly difficult.

For this reason, the single point bonding system in which the inner leads are connected one by one to the corresponding pads is being employed. The connection by such a system is carried out by an ultrasonic compression bonding system or an ultrasonic thermocompression bonding system.

FIG. 8 shows an ultrasonic bonding apparatus according to the prior art single point system. An ultrasonic vibrator 100 and a bonding tool 102 are united by a horn 101, and ultrasonic vibrations generated by the vibrator 100 are transmitted to the bonding tool 102 by the horn 101. In this example, the ultrasonic vibration takes place in the lateral direction in a plane parallel to the plane of the paper, and accordingly, the tool 102 is vibrated also in the lateral direction, as shown by an arrow 200. In bonding, a semiconductor element (chip) 111 placed on a stage 110 is moved so as to be positioned within the so-called device hole of a carrier tape 114, and then a bonding pad 112 of the chip 111 and an inner lead 113 are aligned. As a view, seen in the direction of arrow 115 in FIG. 8A, given in FIG. 8B shows, the inner lead 113 is pressed by the tool 102 against the pad 112 by lowering the horn 101, and the two pieces are connected by subjecting them to ultrasonic vibrations. It is to be noted that in FIG. 8B the tool 102 vibrates in the direction perpendicular to the plane of the paper. In addition, the tip of the tool 102 is machined to have a wedge shape, as shown in the figure, in order to prevent it from making contact with the adjacent inner leads 113.

Accompanying the improvement in the integrated circuit technology, the number of required pins, in other words, the number of bonding pads has been increased, as mentioned above, and the pads 112 are being provided on all of the four sides of the chip 111. In this case, for pads provided along the sides of the chip 111 not illustrated in FIG. 8A their connection with the inner leads 113 is achieved by vibrations in a plane parallel to the plane of the paper.

Each inner lead and the corresponding pad are connected in the manner described above. However, in order to obtain a satisfactory electrical and mechanical connections between them it is necessary to efficiently transmit the ultrasonic vibrations to the contact plane of the inner lead 113 and the pad 112. If the tool 102 makes contact with other inner leads, ultrasonic vibrations attenuate, and as a result, intended connection cannot be obtained.

In the case depicted in FIG. 8 the spacing between the pads (pad pitch) is larger than the width of the tool 102, so there will occur no problem of contact even if the semiconductor chip is of the so-called quad flat package (QFP) type. However, when the pad pitch becomes small due to the demand for larger number of pins, the tool 102 make contact with the adjacent inner leads, as is clear from FIG. 8C, in particular. Therefore, it is necessary to machine the tip of the bonding tool 102 in a thin shape. Moreover, in order to deal with the quad-flat-package (QFP) type semiconductor chips having a small pad pitch, the tip of the tool 102 has to be made thin not only when seen from the front side, as in FIG. 8B, but also when seen sideways as in FIG. 8C. Hence, in a bonding tool using ultrasonic vibrations for QFP type semiconductor chips with small pad pitch, it is conceivable to give its tip the so-called bottleneck shape when seen from the front (rear) direction as well as sideways.

In the actual ultrasonic bonding, however, ultrasonic vibrations are given while applying a load to the tip of the tool so as to press the inner lead 113 onto the pad 112. Because of this, if the tip of the tool 112 is given a bottleneck shape in a simple minded manner, the ultrasonic vibrations to be transmitted to the tip part will be attenuated significantly due to the load for pressing. Substantially, no vibration is transmitted to the tip part, and no connection can be achieved.

SUMMARY OF THE INVENTION

It is therefore an object of this invention to provide a bonding tool which is capable of achieving ultrasonic bonding even for QFP type semiconductor chips having a small pad pitch.

A bonding tool according to one aspect of the present is formed in such a shape that it has a substantially vertical flat plane on one side and a uniformly and continuously sloped plane on the opposite side as seen in a plane parallel to the direction of vibration of the ultrasonic waves.

The bonding tool according to another aspect of the present invention is formed in such a shape that it includes a horn attaching portion and a conically machined portion having an inner lead pressing face at the tip part, where the sloping of the conically machined portion continues uniformly until its diameter is increased to at least 200 μm.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIGS. 5A to 5C are drawings showing the bonding tool according to a third embodiment of this invention;

DETAILED DESCRIPTION OF THE PREFERRED EMBODIMENTS

Figure 1A:
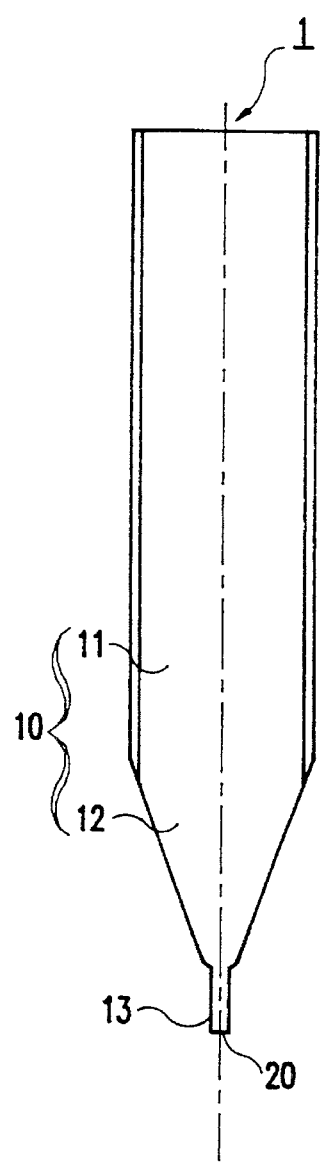
FIGS. 1A to 1D are drawings showing a bonding tool according to a first embodiment of the present invention.
Figure 1B:
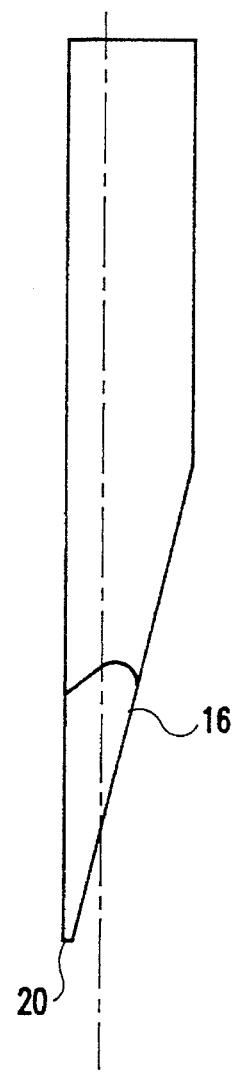
Figure 1C:
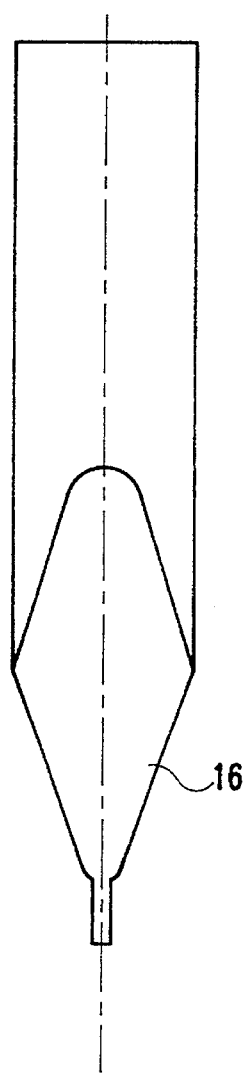
Figure 1D:
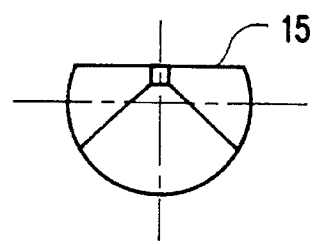

Referring to FIG. 1, there is shown a bonding tool 1 according to a first embodiment of the invention, in which FIGS. 1A, 1B, 1C and 1D are a front view, a side view, a rear view and a bottom view, respectively, of the tool 1. It is noted that the front and the rear views of FIGS. 1A and 1C show the views in the planes perpendicular to the direction in which the tool 1 vibrates due to the ultrasonic waves.

The tool 1 can be formed basically from a columnar metallic rod, from which a flat plane 15 is formed at a position forwardly offset from the center plane in the longitudinal direction of the columnar rod. This flat plane 15 defines one of the outer wall surfaces of main body portion 10 and tip portion 13 of the tool 1. As is clear from FIGS. 1A and 1C, the tip portion 13 is machined in a bottleneck shape when seen in a plane perpendicular to the direction of vibrations. In other words, it is formed projecting from the main body portion 10 with substantially the same width. Since, however, the diameter of the main body portion 10 is about 1.58 mm in contrast to the width of about 80 μm of the tip portion, the main body portion 10 is machined tapered from the attaching portion 11 to the horn 101 through a part indicated as 12 to be continued to the tip portion 13.

On the other hand, the side shape corresponding to the tip portion 13 of the tool 1 is not subjected to bottleneck machining, as is clear from FIG. 1B. Instead, a continuously uniform slope machining making a prescribed angle with the center plane is provided from the edge of inner lead pressing surface 20 (it is a square with a side of 80 μm in this embodiment) of the tip portion 13 up to an outer wall part situated oppsote to the flat plane 15 of the main body 10, forming a sloped surface 16. In this embodiment the sloped surface 16 is formed making an angle of 10° with the center plane.

Figure 8A:
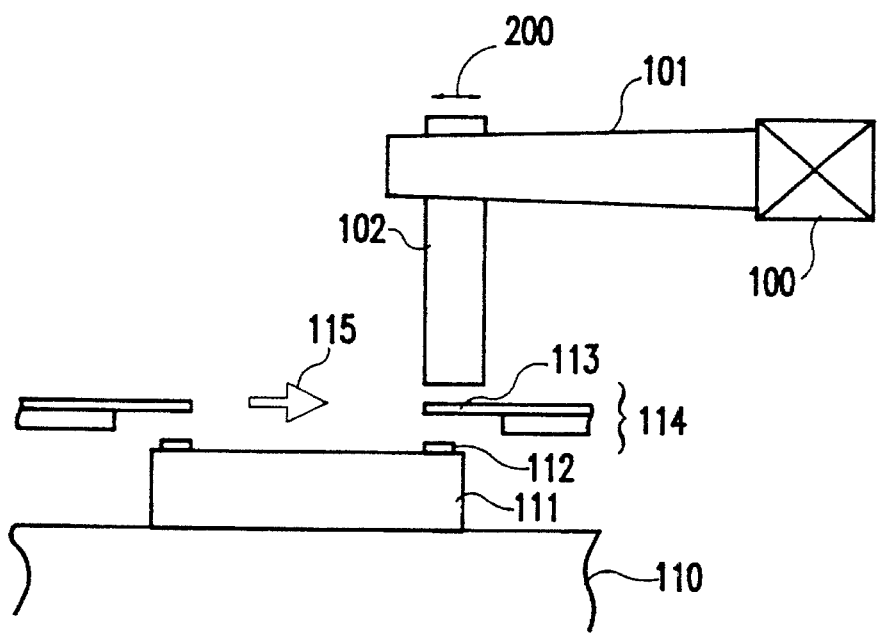
FIGS. 8A to 8C are drawings showing the prior art tool and its method of bonding.

By the use of such a bonding tool, it was confirmed that the ultrasonic vibrations from the vibrator 100 in FIG. 8 can be transmitted via the horn 101 to the tip portion 13 of the tool 1 with the efficiency of substantially 100%. This is because the tool 1 is not machined in bottleneck shape in the plane parallel to the direction of vibration, and the sloped surface 16 is formed in a uniformly continuous manner from the pressing surface 20 which is complementing the deterioration of the mechanical strength due to the bottleneck machining.

Figure 3A:
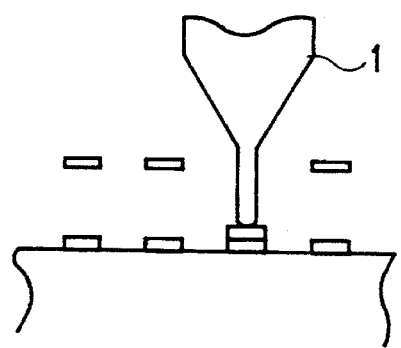
FIGS. 3A and 3B are drawings showing the situation in ultrasonic bonding using the tool in FIG. 1.
Figure 3B:
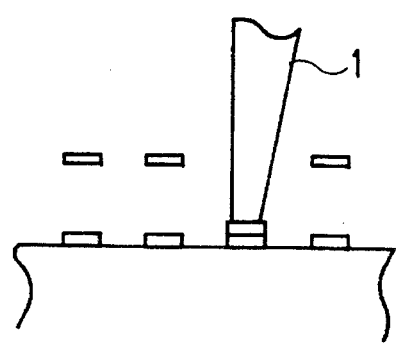
Figure 8B:
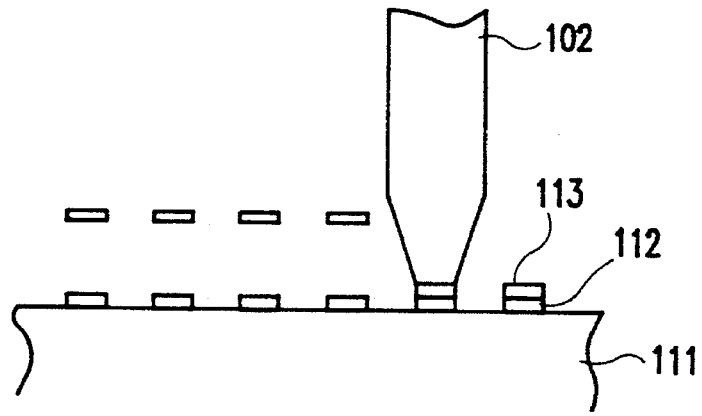
Figure 8C:
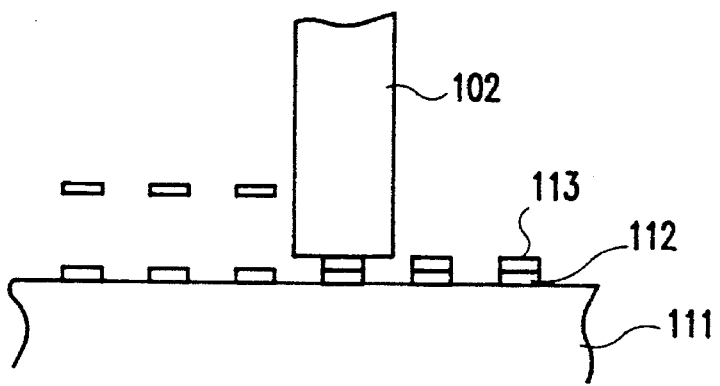

The ultrasonic bonding by the single point system employing a film carrier for a QFP type semiconductor chip can be carried out in a similar manner by replacing the tool 102 in FIG. 8 by the present bonding tool 1. In replacing the tool, however, care has to be exercised to attach the tool 1 to the horn 101 in such a way to have the flat plane 15 of the tool 1 to be perpendicular to the direction of vibration. The proper way of attaching the tool is illustrated in FIGS. 3A and 3B which correspond to FIGS. 8B and 8C, respectively.

Figure 2A:
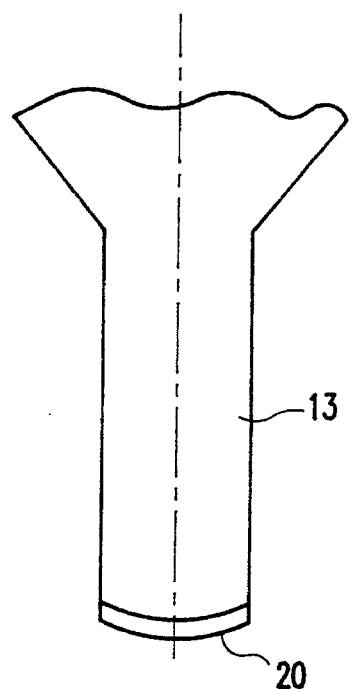
FIGS. 2A to 2C shows the enlarged views of the tip portion of the tool in FIG. 1.
Figure 2B:
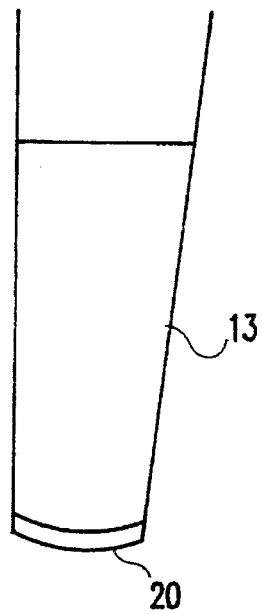
Figure 2C:
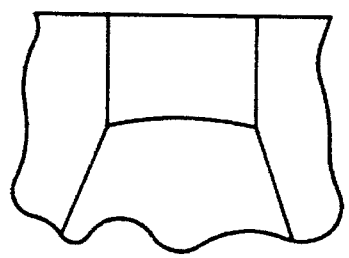

Although the inner lead pressing surface 20 of the tip portion 13 of the tool 1 is shown to be formed flat in FIG. 1, in reality the pressing surface 20 is formed with certain curvature as shown in its enlarged views given in FIG. 2 in which FIGS. 2A, 2B and 2C are a front view, a side view and a bottom view, respectively.

Figures 4A, 4B:
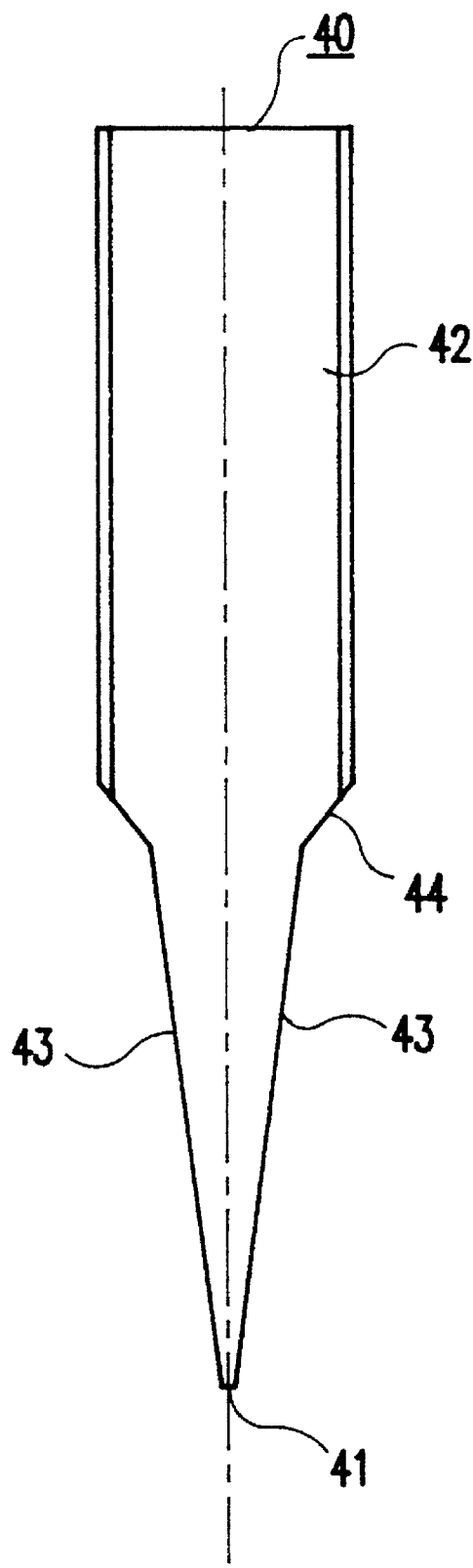
FIGS. 4A and 4B are drawings showing the bonding tool according to a second embodiment of the invention.

Turning to FIG. 4, a tool 40 according to a second embodiment does not have the tip portion machined in bottleneck shape, and instead it is machined as a sloped surface 43 which continues uniformly from the pressing face 41 against the inner lead positioned on the center line of the tool 40 toward both outer walls of the main body portion 42, as can be seen from its front view of FIG. 4A. The angle formed by the two sloping surfaces 43 is set to be 10°. The sloped surface 43 is continued to the main body portion 42 through a slope 44 which makes an angle of 45° with the center line. The side surfaces of this tool 40 are machined so as to give the same shape as in the previous embodiment, and the bottom view is identical to that in FIG. 1D, so further description about them will be omitted.

It was also confirmed for this embodiment that the ultrasonic vibrations are transmitted to the pressing face 41 with substantial efficiency of 100% similar to the case of the tool 1.

Referring now to FIG. 5, a bonding tool 50 according to a third embodiment of the invention is machined conically following the shape of the pressing face 51 at the tip, as shown in the front (side) view of FIG. 5A and the bottom view of FIG. 5C. The diameter of the pressing face 51 is 80 μm which is the same as in FIG. 1, and the conical machining starts from the pressing face 51 making an angle of 10° with the center line. Therefore, the conical part forms a uniformly sloped surface 52 over a range larger than one half of the length of the tool 50, leaving the portion above the conical portion as the attaching part to the horn. Further, the pressing face 51 can be made flat, but in reality it is given a shape with a predetermined curvature similar to the tool in FIG. 2. Since the tool 50 reaches the pressing face 51 by gradually reducing its diameter from the original size, the ultrasonic vibrations can also be transmitted in this example to the pressing face 51 with no substantial attenuation.

Figure 6A:
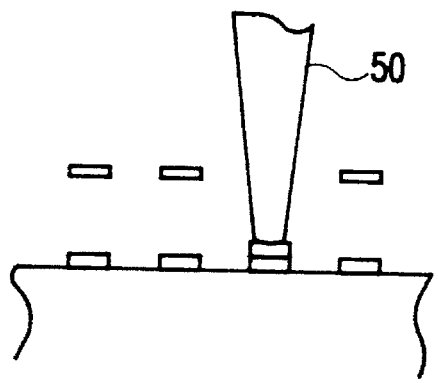
FIGS. 6A and 6B are drawings showing the situation in ultrasonic bonding using the tool shown in FIG. 5.
Figure 6B:
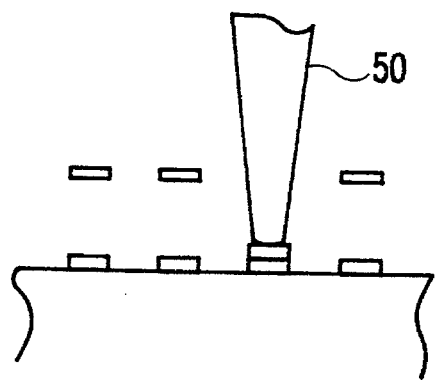

In FIG. 6 is shown the situation during ultrasonic bonding. It should be noted in this embodiment that the machining is markedly easy compared with the case of the tool in FIG. 1 so that it is possible to use a ceramic as the material for the tool. Accordingly, generation of chippings during the bonding is less compared with the case of the tool in FIG. 1 or 4. Further, if there is a need for directivity in attaching the tool to the horn 101, a part of the tool 50 may be machined flat as indicated by 53 in FIG. 5C.

Figure 7:
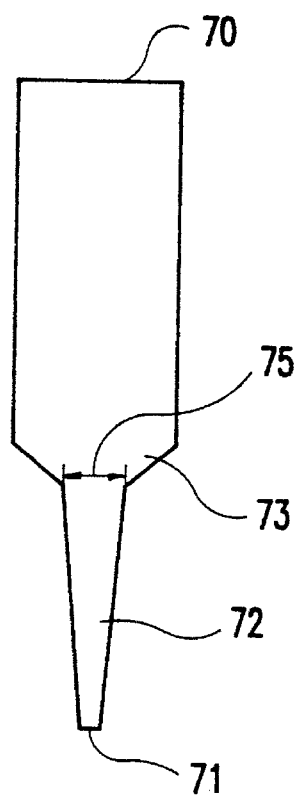
FIG. 7 is a drawing showing the bonding tool according to a fourth embodiment of the invention.

Turn now to FIG. 7 showing a still another embodiment according to the invention. In the tool shown in FIG. 5, uniform conical machining stating from the pressing face 51 is given expanding upward making a prescribed angle with the center line. In the tool in FIG. 7, however, it is constituted of a conically machined portion 72 which makes an angle of 10° with the center line, and another conically machined portion 73 which joins the portion 72 and makes an angle of 45° with the center line. An effect similar to the foregoing embodiments can also be obtained by this embodiment, but what is of concern is the length of the first conically machined portion 72, or the size of the diameter 75 of the portion 72 on the side opposite to the pressing face 71. If the diameter 75 is taken small, the ultrasonic waves will not be transmitted as already mentioned above. According to the investigation by the present inventors, for all cases of the pressing face diameter of 100, 80 and 60 μm, desired transmission factor can be achieved by forming the first conically machined portion 72 until its diameter becomes greater than 200 μm.

Although the angle between the center line and the sloped surface of the tool in every embodiment was assumed to be 10°, it may be varied in the range of 5° to 30° depending upon the pad pitch. Moreover, narrow pitch can be made feasible by appropriately reducing the width of the pressing face corresponding to the reduction of the pitch, and combining the reduction procedure with the above-mentioned freedom in the selection of the angle. Further, the columnar rod used as the raw material in each embodiment may be replaced by a square rod.

In short, in this invention, the size and the shape of the pressing face at the tip of the tool and the sloping angle (namely, the sloping angle which prevents the tool from making contact with the adjacent inner leads) at the pressing face are determined in accordance with the pitch of the pad and the width of the inner lead that are the objects of the bonding, then making the shape of the tool as seen in a plane parallel to the direction of the vibration to be a substantially flat plane on one side and a sloping surface that slopes continuously in a uniform manner, with the above-mentioned sloping angle, on the other side, or giving a uniform conical machining with the above-mentioned sloping angle, starting from the pressing face, wherein the conically machined portion is formed uniformly continuously until the diameter grows to more than 200 μm.

As described in the above, by the use of the bonding tool according to these inventions, ultrasonic bonding of the inner leads to the corresponding pads of a QFP type semiconductor chip having a small pad pitch becomes possible according to the single point system.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A bonding tool for bonding a conductor lead to a pad by ultrasonic vibrations, said bonding tool comprising:

a body having first and second ends and a front surface;

a shoulder portion extending from said second end of said body and having an end, said shoulder portion having a front surface and a sloped back surface, said shoulder portion decreasing in width toward said end thereof; and a tip portion extending from said end of said shoulder portion and having an end for pressing said lead, said tip portion having a front surface and a sloped back surface, and wherein said front surfaces of said body, said shoulder portion and said tip portion form a uniform continuous surface, and wherein said back surfaces of said shoulder portion and said tip portion form a uniform sloped surface, such that said bonding tool decreases in thickness toward said end of said tip portion.

2. A bonding tool according to claim 1, wherein said uniform continuous surface is perpendicular to a direction of said ultrasonic vibration.

3. A bonding tool according to claim 1, wherein said end of said tip portion has a curvature so as to protrude from said tip portion.

4. A bonding tool according to claim 1, wherein said tip portion has a width of about 80 μm.

5. A bonding tool according to claim 1, wherein said uniform sloped surface forms an angle of about 5° to 30° with respect to a center line of said bonding tool.

6. A bonding tool according to claim 1, wherein said body comprises a rodlike body and wherein said uniform continuous surface is parallel to a center line of said bonding tool.

7. A bonding tool according to claim 1, wherein said tip portion has a substantially uniform width.

8. A bonding tool for bonding a conductor lead to a pad by ultrasonic vibrations, comprising:

a body having a neck; and a conical portion extending from said neck of said body and having an end for pressing said lead, said conical portion decreasing in diameter toward said end thereof, wherein said conical portion has a diameter of at least 200 μm at said neck of said body.

9. A bonding tool according to claim 8, wherein a portion of said conical portion between said neck portion and said end has a diameter of about less than 200 μm.

10. A bonding tool according to claim 9, wherein said portion between said neck portion and said end has a diameter between about 60 and 100 μm.

11. A bonding tool according to claim 8, wherein said conical portion forms an angle of about 5° to 30° with respect to a center line of said bonding tool.

12. A bonding tool according to claim 8, wherein said neck of said body is conically shaped.

13. A bonding tool according to claim 8, wherein said bonding tool includes a flat portion.

14. A bonding tool according to claim 6, wherein said body comprises a rodlike body.

15. An ultrasonic bonding apparatus, comprising:

a bonding tool; and a vibrator for vibrating said bonding tool in a vibrating direction, wherein said bonding tool comprises:
        a body having first and second ends and a front surface;
        a shoulder portion extending from said second end of said body and having an end, said shoulder portion having a front surface and a sloped back surface, said shoulder portion decreasing in width toward said end thereof; and
        a tip portion extending from said end of said shoulder portion and having an end for pressing said lead, said tip portion having a front surface and a sloped back surface, wherein said front surfaces of said body, said shoulder portion and said tip portion form a uniform continuous surface, said back surfaces of said shoulder portion and said tip portion form a uniform sloped surface such that said bonding tool decreases in thickness toward said end of said tip portion, and wherein said uniform plain surface being perpendicular to a direction of vibration exerted by said vibrator.

16. A bonding tool according to claim 15, wherein said body comprises a rodlike body and wherein said uniform continuous surface is parallel to a center line of said bonding tool.

17. A bonding tool according to claim 15, wherein said tip portion has a substantially uniform width.

18. An ultrasonic bonding apparatus, comprising:

a bonding tool; and a vibrator for vibrating said bonding tool in a vibrating direction, wherein said bonding tool comprises:

a body having a neck; and a conical portion extending from said neck of said body and having an end for pressing said lead, said conical portion decreasing in diameter toward said end thereof, wherein said conical portion has a diameter of at least 200 μm at said neck of said body.

19. An ultrasonic bonding apparatus according to claim 18, wherein a portion of said conical portion between said neck portion and said end has a diameter of about less than 200 μm.

20. A bonding tool according to claim 19, wherein said portion between said neck portion and said end has a diameter between about 60 and 100 μm and wherein said conical portion forms an angle of about 5° to 30° with respect to a center line of said bonding tool.

* * * * *